United States Patent
Liu et al.

(10) Patent No.: US 6,211,075 B1
(45) Date of Patent: Apr. 3, 2001

(54) METHOD OF IMPROVING METAL STACK RELIABILITY

(75) Inventors: Chung-Shi Liu; Shau-Lin Shue; Chen-Hua Yu; Hung-Ju Chien, all of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/244,881

(22) Filed: Feb. 5, 1999

(51) Int. Cl.[7] ................................................. H01L 21/44
(52) U.S. Cl. ............................ 438/656; 438/937; 430/313
(58) Field of Search .................................... 438/656, 629, 438/643, 688, 649, 627, 648, 937; 430/313; 257/751

(56) References Cited

U.S. PATENT DOCUMENTS

| | | | |
|---|---|---|---|
| 5,290,731 | 3/1994 | Sugano et al. | 437/174 |
| 5,543,357 | 8/1996 | Yamada et al. | 437/192 |
| 5,552,339 | 9/1996 | Hsieh | 437/190 |
| 5,736,458 * | 4/1998 | Teng et al. | 438/627 |
| 5,750,439 | 5/1998 | Naito | 438/648 |
| 5,776,830 | 7/1998 | Sami et al. | 438/643 |
| 5,970,378 * | 10/1999 | Shue et al. | 438/656 |

* cited by examiner

*Primary Examiner*—Matthew Smith
*Assistant Examiner*—Calvin Lee
(74) *Attorney, Agent, or Firm*—George O. Saile; Stephen B. Ackerman

(57) ABSTRACT

A method for increasing electromigration resistance within the metal stack layer of Wolfram plugs by applying air exposure or plasma treatment to the top surface of the first layer of metal within the metal stack layer that is formed on top of metal plugs. The remainder of the process of the formation of the metal stack layer is not affected by the present invention.

58 Claims, 2 Drawing Sheets

METHOD OF IMPROVING METAL STACK RELIABILITY

BACKGROUND OF THE INVENTION (1) Field of the Invention

The present invention relates to the field of semiconductor manufacturing, and more specifically to a method of improving the metal stack reliability within the structure of a semiconductor.

(2) Description of Prior Art

As the technology moves to smaller dimensions, one of the most difficult obstacles to continued reductions in size is the level to level alignments in lithography, especially in complex structures of metals and contacts. Consequently, the metal packing density becomes limited by design rules that control the separation of one level of contacts from a subsequent or adjacent level, and by design rules for the tolerance of nesting of contacts or for borders used around contacts.

Contacts can be made, for instance, between an upper via and a lower metal plug, the latter having a profile in the shape of a W with the bottom of the profile being flat. The upper via may have the profile of a V. In this instance, a good contact can be made if the upper via is stacked on top of the metal plug. If the alignment of the metal via with the metal plug is poor, poor step coverage will occur and good stacked contact will be difficult to establish.

If the lower contact is made with a non-plug profile then poor alignment between the two levels of contact results in poor contact.

If the metal-plug control can be maintained, as in the damascene process, then multiple stacking of contacts can be accomplished. It is however clear that delicate and precise control of alignment between the various levels of contact is required, even where damascene type solid plugs are used within the stacking sequence.

The problem of establishing proper contact stacking is further exacerbated with the use of borderless contacts, that is contacts that have, as opposed to the above mentioned W profile, the profile that exhibits only one side. These contacts typically provide very little contact area between the upper level via and the lower level metal making for a very unreliable contact. With any misalignment, even making any contact is not assured. If the lithography misalignment is significant, the contact area is smaller still, and current crowding can occur as a results at the via contact.

With multiple levels of metalization, it is necessary to pass current from one level to another through vias. With ever-smaller design features, the size of the contact holes also shrinks and the current density in the vias can become exceedingly high. This leads to via electromigration (EM) that can be caused by poor metal step coverage or a different metal being used in the vias causing local current crowding. Either of these two reasons can cause severe contact electromigration.

The present invention addresses the case where a contact via is used and where the contact via has the above-indicated W profile. It is readily apparent that the walls of this profile are covered only with a layer (of for instance aluminum) that has a very finite thickness and that, as a consequence, causes a very heavy flow of current though the walls of the via. This high current density can be up to three to five times higher than the EM design limits and will cause early EM failure. This problem requires an improvement of the step coverage; this improvement is accomplished using Aluminum (Al) or Wolfram (W) plugs. Even with the use of plugs, however, current crowding can still occur when current goes through the plug and into the next level of (Al) wire and the current has to turn through a 90° angle in order to enter the Al wire. The inner corner of the plug will in this case attract the heaviest current since this inner corner is the path of least resistance to the current.

It is clear from the above that current crowding and the subsequent EM effect can be reduced by either a proper use of the materials that come into contact with each other or by providing for a design of the interfacing surfaces that eliminates current crowding at corners within the contacting surfaces.

In addition to the above indicated design considerations for W-shaped plugs, a design objective in designing metal stack for the W-shaped plugs is to increase the EM resistance within the metal stack that is deposited on top of the metal plug. The present invention teaches methods of increasing the EM resistance of this metal stack and, in so doing, reducing the effects of electromigration.

Layers of metal are, within the Prior Art, deposited on top of the W-shaped plug. The layers of metal form the electrical interface with the metal plug. Prior Art for the formation of Wolfram plugs makes extensive use of TiN/AlCu/TiN-ARC or Ti/TiN/AlCu/TiN-ARC or TiN/Ti/AlCu/TiN-ARC or TiN/AlCu/Ti/TiN-ARC layers that are deposited on top of the metal plug in the sequence in which the materials are listed. Since AlCu forms the main part of these metal layers, the metal stack layers are referred to as AlCu metal stack layers. The present invention teaches specific processes used during the deposition of the metal stack layers.

U.S. Pat. No. 5,736,458 (Teng) shows a Ti deposition, and a $N_2$ treatment followed by a vacuum break.

U.S. Pat. No. 5,750,439 (Naito) shows a TiON layer in a contact hole and an aluminum copper alloy line.

U.S. Pat. No. 5,543,357(Yamada et al.) discusses TiON layers in the prior art.

U.S. Pat. Nos. 5,776,830 (Sumi et al.), 5,552,339 (Hsieh) and 5,290,731 (Sugano et al.) show metal stack structures.

SUMMARY OF THE INVENTION

It is the primary objective of the present invention to increase AlCu electromigration resistance within the metal stack layer of the W-shaped plug.

It is a further objective of the present invention to reduce electromigration within the metal stack layer that is deposited on top of the W-shaped plug as a means of establishing electrical contact with the plug.

The present invention addresses the above indicated problems of EM failure by teaching a selection and treatment of materials used for the layers of metal that are stacked on top of a Wolfram metal plug. This layer of metal, also referred to as the metal stack, serves the purpose of forming the electrical interfacing with the Wolfram W-shaped plug. The methods of the present invention sharply increase EM resistance and, in so doing, sharply reduce the EM failure rate.

In the first embodiment of the present invention the increase of the AlCu electromigration resistance within the metal stack is accomplished by introducing a vacuum-break at the TiNo surface that is contained within the metal stack that is used to form electrical contact with a Wolfram plug.

In the second embodiment of the present invention the increase in AlCu electromigration resistance within the metal stack layer is accomplished by applying an plasma treatment to the TiNo surface that is contained within the metal stack layer that is used to form electrical contact with a Wolfram plug.

DESCRIPTION OF THE PREFERRED EMBODIMENTS

Figure 1:
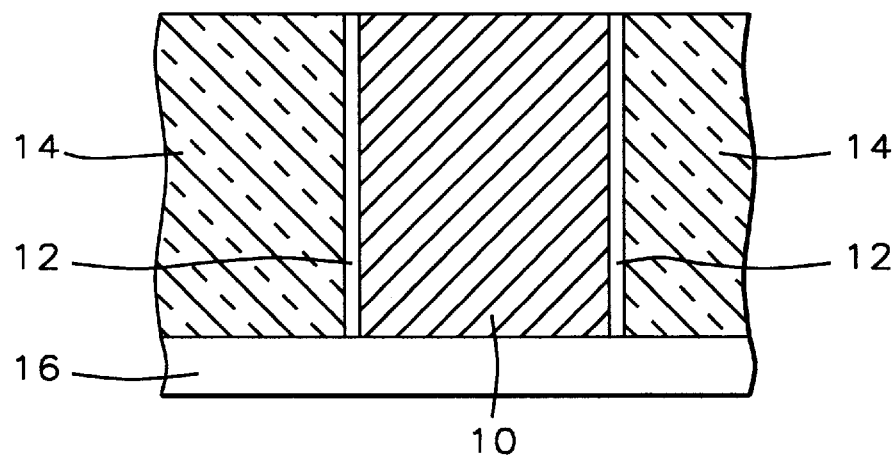
FIG. 1 shows the W-plug formation.

Referring now more specifically to FIG. 1, there is shown the W-shaped Wolfram plug 10 with a Ti/TiN barrier 12 formed between the body of the plug 10 and the surrounding dielectric 14. The dielectric 14 can, for instance, be $SiO_2$. The metal plug 10 is being formed on top of a layer 16 that can contain, for instance, metal or a silicide.

Figure 2:
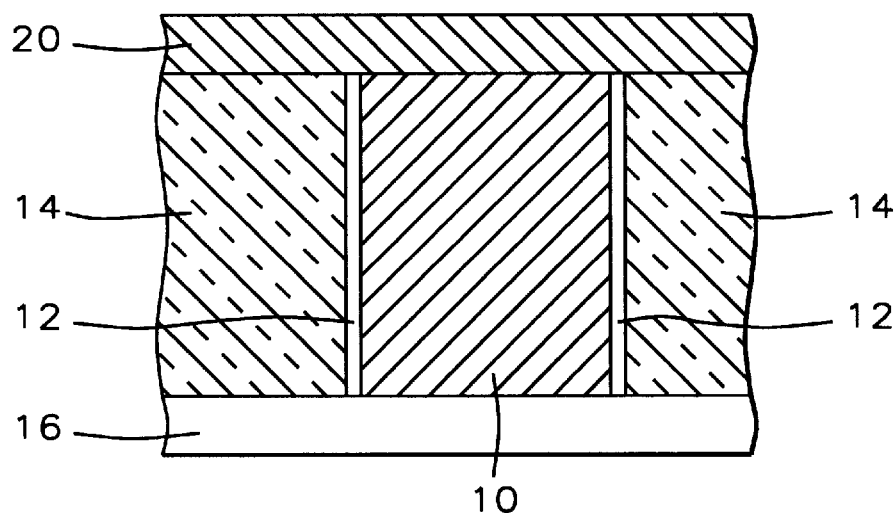
FIG. 2 shows the deposition of TiN.

FIG. 2 shows the first layer of metal 20 that is deposited on top of the Wolfram plug 10. Layer 20 can contain TiN or Ti combined with TiN. Layer 20 can be deposited using Physical Vapor Deposition or Chemical Vapor Deposition technology.

Figure 3:
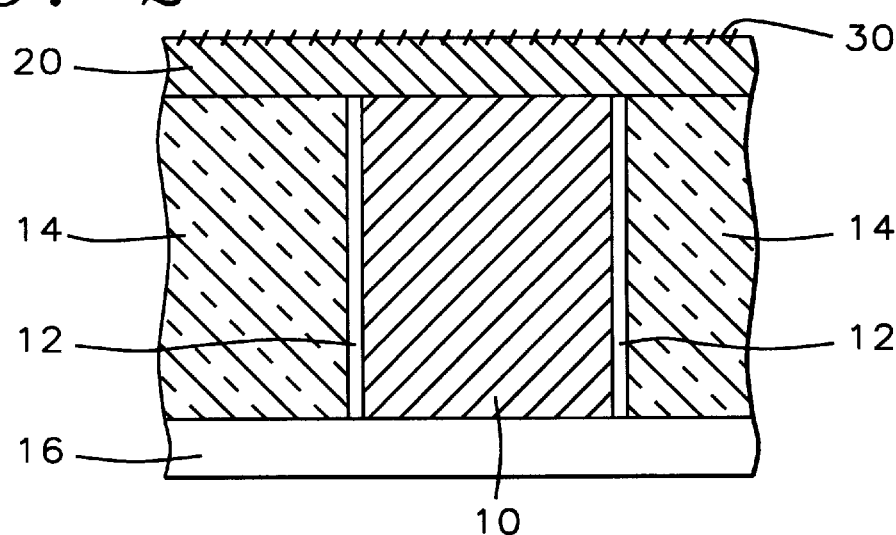
FIG. 3 shows the air exposure of the TiN surface.

FIG. 3 is a presentation of the vacuum break 30 that is introduced at this level within the metal stack layer. The vacuum break 30 is created by air exposure of the top surface of layer 20, this exposure condenses or solidifies the molecular structure of the top surface 30 of layer 20 which results in increased EM resistance of the interface of layer 20 with the remaining layers of the metal stack. These remaining layers of the metal stack are deposited on top of layer 20. The indicated air exposure of the top surface of layer 20 is an atmospheric exposure at room temperature in a clean room environment for the duration of several minutes.

Figure 4:
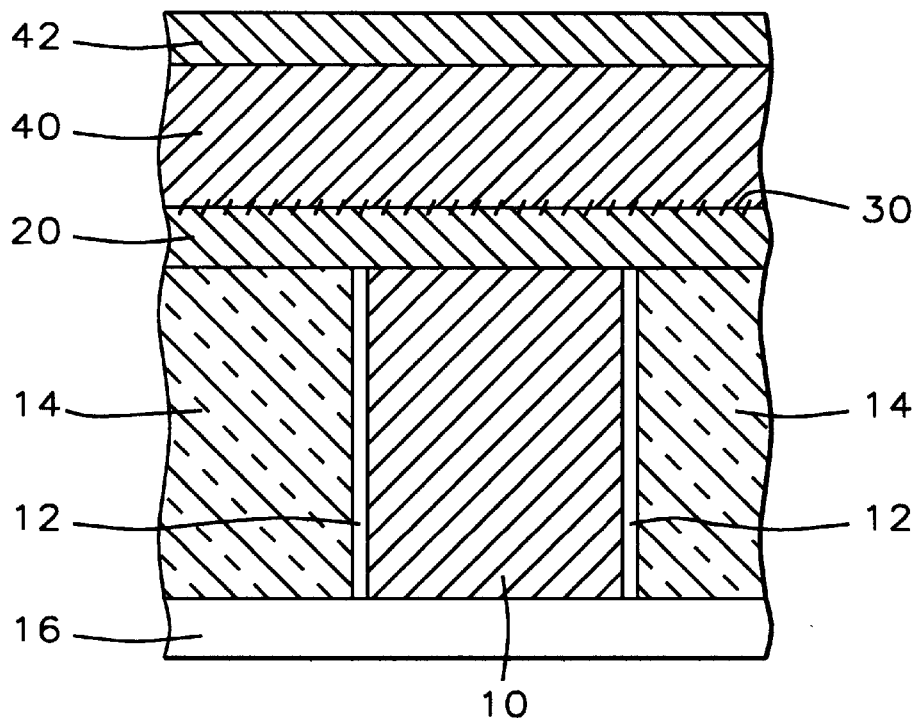
FIG. 4 shows the deposition of AlCu/TiN-ARC.

FIG. 4 shows the deposition of the main layer of the metal stack, that is the deposition of the AlCu layer 40. The metal stack is completed by the deposition of a layer 42 of TiN-ARC on top of layer 40.

Figure 5:
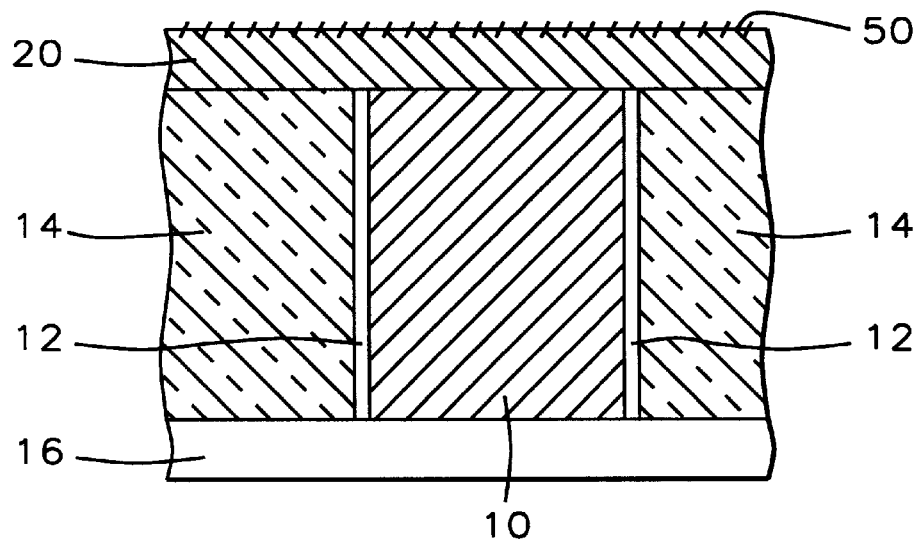
FIG. 5 shows the $N_2O$ plasma treatment of the TiNo surface.

FIG. 5 shows the plasma treatment of the top surface 50 of layer 20. The plasma treatment is performed under a pressure within the range of between 1 and 50 Torr, an rf power of about 200 watts, a temperature within the range between 300 and 400 degrees C. and a duration of about 20 seconds. Layer 20 can, as shown in FIG. 2, contain TiN or Ti combined with TiN and can be deposited using PVD or CVD deposition technology. The plasma treatment of surface 50 consists of a $N_2O$ plasma treatment. The plasma treatment condenses or solidifies the molecular structure of the top surface 50 of layer 20 which results in increased EM resistance of the interface of layer 20 with the remaining layers of the metal stack. These remaining layers are deposited on top of layer 20.

The partially completed metal stack shown in FIG. 5 is completed as previously shown under FIG. 4, that is a layer 40 of AlCu is deposited on top of the surface 50 followed by the deposition of a TiN-ARC layer 42. The presentation of the completed metal layer for FIG. 5 is identical to the presentation shown is FIG. 4.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for improving metal stack reliability in forming a metal interconnect with metal plugs within a semiconductor device, comprising the steps of:

providing a surface within a semiconductor structure, wherein said surface is a layer of silicide;

forming a metal plug on top of said surface;

depositing a first layer of the metal stack layer;

exposing the top surface of said first layer to air; and depositing the remainder of said metal stack layer.

2. The method of claim 1 wherein said surface is a layer of metal.

3. The method of claim 1 wherein said surface is a base layer formed within the construct of a semiconductor device.

4. The method of claim 1 wherein said forming a metal plug on top of said surface is:

depositing a layer of dielectric on top of said surface;

forming a via pattern in said layer of dielectric;

depositing a barrier within the openings of said via pattern;

depositing a layer of metal over said layer of dielectric and said via pattern; and planarizing said layer of metal down to the top surface of said layer of dielectric.

5. The method of claim 4 wherein said barrier contains titanium.

6. The method of claim 4 wherein said barrier contains titanium nitrite.

7. The method of claim 4 wherein said barrier contains titanium and titanium nitrite.

8. The method of claim 1 wherein said metal plug contains Wolfram.

9. The method of claim 1 wherein depositing a first layer of the metal stack layer is depositing a layer of TiN.

10. The method of claim 1 wherein depositing a first layer of the metal stack layer is depositing a layer of Ti followed by depositing a layer of TiN.

11. The method of claim 1 wherein depositing a first layer of the metal stack layer is depositing a layer of TiN followed by depositing a layer of Ti.

12. The method of claim 1 wherein said depositing the remainder of said metal stack is depositing a layer of AlCu followed by depositing a layer of TiN-ARC.

13. The method of claim 1 wherein said depositing the remainder of said metal stack is depositing a layer of AlCu followed by depositing a layer of Ti followed by creating a TiN-ARC (TiN Anti Reflective Coating).

14. A method for improving metal stack reliability in forming a metal interconnect with metal plugs within a semiconductor device, comprising the steps of:

providing a surface within a semiconductor structure, wherein said surface is a layer of silicide;

forming a metal plug on top of said surface;

depositing a first layer of the metal stack layer;

exposing the top surface of said first layer to plasma treatment; and depositing the remainder of said metal stack layer.

15. The method of claim 14 wherein said surface is a layer of metal.

16. The method of claim 14 wherein said surface is a base layer formed within the construct of a semiconductor device.

17. The method of claim 14 wherein said forming a metal plug on top of said surface is:

depositing a layer of dielectric on top of said surface;

forming a via pattern in said layer of dielectric;

depositing a barrier within the openings of said via pattern;

depositing a layer of metal over said layer of dielectric and said via pattern; and planarizing said layer of metal down to the top surface of said layer of dielectric.

18. The method of claim 17 wherein said barrier contains titanium.

19. The method of claim 17 wherein said barrier contains titanium nitrite.

20. The method of claim 17 wherein said barrier contains titanium and titanium nitrite.

21. The method of claim 14 wherein said metal plug contains Wolfram.

22. The method of claim 14 wherein depositing a first layer of the metal stack layer is depositing a layer of TiN.

23. The method of claim 14 wherein depositing a first layer of the metal stack layer is depositing a layer of Ti followed by depositing a layer of TiN.

24. The method of claim 14 wherein depositing a first layer of the metal stack layer is depositing a layer of TiN followed by depositing a layer of Ti.

25. The method of claim 14 wherein exposing said top surface of said first layer to plasma treatment is applying a $N_2O$ plasma treatment to said top surface.

26. The method of claim 14 wherein said depositing the remainder of said metal stack is depositing a layer of AlCu followed by forming a layer of TiN-ARC.

27. The method of claim 14 wherein said depositing the remainder of said metal stack is depositing a layer of AlCu followed by depositing a layer of Ti followed by forming a layer of TiN-ARC.

28. The method of claim 14 wherein said plasma treatment is applied in-situ or ex-situ.

29. A method for improving metal stack reliability in forming a metal interconnect with metal plugs within a semiconductor device, comprising the steps of:

providing a surface within a semiconductor structure;

forming a metal plug on top of said surface;

depositing a first layer of the metal stack layer;

exposing the top surface of said first layer to air, wherein said exposing the top surface of said first layer to air is an atmospheric exposure performed at room temperatures in a clean room environment for a time duration within the range of between 1 and four minutes; and depositing the remainder of said metal stack layer.

30. The method of claim 29 wherein said surface is a layer of metal.

31. The method of claim 29 wherein said surface is a layer of silicide.

32. The method of claim 29 wherein said surface is a base layer formed within the construct of a semiconductor device.

33. The method of claim 29 wherein said forming a metal plug on top of said surface is:

depositing a layer of dielectric on top of said surface;

forming a via pattern in said layer of dielectric;

depositing a barrier within the openings of said via pattern;

depositing a layer of metal over said layer of dielectric and said via pattern; and planarizing said layer of metal dow to the top surface of said layer of dielectric.

34. The method of claim 33 wherein said barrier contains titanium.

35. The method of claim 33 wherein said barrier contains titanium nitrite.

36. The method of claim 33 wherein said barrier contains titanium and titanium nitrite.

37. The method of claim 29 wherein said metal plug contains Wolfram.

38. The method of claim 29 wherein depositing a first layer of the metal stack layer is depositing a layer of TiN.

39. The method of claim 29 wherein depositing a first layer of the metal stack layer is depositing a layer of Ti followed by depositing a layer of TiN.

40. The method of claim 29 wherein depositing a first layer of the metal stack layer is depositing a layer of TiN followed by depositing a layer of Ti.

41. The method of claim 29 wherein said depositing the remainder of said metal stack is depositing a layer of AlCu followed by depositing a layer of TiN-ARC.

42. The method of claim 29 wherein said depositing the remainder of said metal stack is depositing a layer of AlCu followed by depositing a layer of Ti followed by creating a TiN-ARC (TiN Anti Reflective Coating).

43. A method for improving metal stack reliability in forming a metal interconnect with metal plugs within a semiconductor device, comprising the steps of:

providing a surface within a semiconductor structure;

forming a metal plug on top of said surface;

depositing a first layer of the metal stack layer;

exposing the top surface of said first layer to plasma treatment, wherein said exposing said top surface of said first: layer to plasma treatment is performed under a pressure within the range of between 1 and 50 Torr, an rf power within the range of between 150 and 250 watts, a temperature within the range between 300 and 400 degrees C. and a duration within the range between 15 and 25 seconds; and depositing the remainder of said metal stack layer.

44. The method of claim 43 wherein said surface is a layer of metal.

45. The method of claim 43 wherein said surface is a layer of silicide.

46. The method of claim 43 wherein said surface is a base layer formed within the construct of a semiconductor device.

47. The method of claim 34 wherein said forming a metal plug on top of said surface is:

depositing a layer of dielectric on top of said surface;

forming a via pattern in said layer of dielectric;

depositing a barrier within the openings of said via pattern;

depositing a layer of metal over said layer of dielectric and said via pattern; and planarizing said layer of metal down to the top surface of said layer of dielectric.

48. The method of claim 47 wherein said barrier contains titanium.

49. The method of claim 47 wherein said barrier contains titanium nitrite.

50. The method of claim 47 wherein said barrier contains titanium and titanium nitrite.

51. The method of claim 43 wherein said metal plug contains Wolfram.

52. The method of claim 43 wherein depositing a first layer of the metal stack layer is depositing a layer of TiN.

53. The method of claim 43 wherein depositing a first layer of the metal stack layer is depositing a layer of Ti followed by depositing a layer of TiN.

54. The method of claim 43 wherein depositing a first layer of the metal stack layer is depositing a layer of TiN followed by depositing a layer of Ti.

55. The method of claim 43 wherein exposing said top surface of said first layer to plasma treatment is applying a $N_2O$ plasma treatment to said top surface.

56. The method of claim 43 wherein said depositing the remainder of said metal stack is depositing a layer of AlCu followed by forming a layer of TiN-ARC.

57. The method of claim 43 wherein said depositing the remainder of said metal stack is depositing a layer of AlCu followed by depositing a layer of Ti followed by forming a layer of TiN-ARC.

58. The method of claim 43 wherein said plasma treatment is applied in-situ or ex-situ.

* * * * *